United States Patent
Khlat et al.

(10) Patent No.: US 11,962,338 B2
(45) Date of Patent: Apr. 16, 2024

(54) EQUALIZATION FILTER CALIBRATION IN A TRANSCEIVER CIRCUIT

(71) Applicant: Qorvo US, Inc., Greensboro, NC (US)

(72) Inventors: Nadim Khlat, Cugnaux (FR); James M. Retz, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 2 days.

(21) Appl. No.: 17/737,300

(22) Filed: May 5, 2022

(65) Prior Publication Data

US 2023/0080652 A1    Mar. 16, 2023

Related U.S. Application Data

(60) Provisional application No. 63/303,531, filed on Jan. 27, 2022, provisional application No. 63/245,139, filed on Sep. 16, 2021.

(51) Int. Cl.
*H04B 1/04* (2006.01)
*H04B 1/00* (2006.01)
*H04B 1/76* (2006.01)

(52) U.S. Cl.
CPC ............. *H04B 1/04* (2013.01); *H04B 1/0078* (2013.01); *H04B 1/76* (2013.01); *H04B 2001/0416* (2013.01)

(58) Field of Classification Search
CPC ............... H03F 3/245; H03F 2200/451; H03F 2200/102; H03F 3/19; H03F 1/3247;
(Continued)

(56) References Cited

U.S. PATENT DOCUMENTS

| 4,797,898 A | 1/1989 | Martinez |
| 7,663,436 B2 | 2/2010 | Takano et al. |

(Continued)

FOREIGN PATENT DOCUMENTS

| CN | 105812073 A | 7/2016 |
| CN | 110798155 A | 2/2020 |

(Continued)

OTHER PUBLICATIONS

Non-Final Office Action for U.S. Appl. No. 17/700,700, dated Apr. 13, 2023, 11 pages.
(Continued)

*Primary Examiner* — Golam Sorowar
(74) *Attorney, Agent, or Firm* — Withrow & Terranova, P.L.L.C.

(57) ABSTRACT

Equalization filter calibration in a wideband transmission circuit is provided. The transceiver circuit generates a radio frequency (RF) signal(s) from a time-variant modulation vector and a power amplifier circuit(s) amplifies the RF signal(s) based on a modulated voltage. The transceiver circuit is configured to apply an equalization filter to the time-variant modulation vector to thereby compensate for a voltage distortion filter created at the output stage of the power amplifier circuit(s). In embodiments disclosed herein, a calibration circuit can be configured to calibrate the equalization filter across multiple frequencies within a modulation bandwidth of the power amplifier circuit to generate a gain offset lookup table (LUT) and a delay LUT. As a result, the equalization filter can be dynamically adapted to reduce undesired instantaneous excessive compression and/or spectrum regrowth resulting from the voltage distortion filter across the modulation bandwidth of the power amplifier circuit.

18 Claims, 14 Drawing Sheets

(58) Field of Classification Search
CPC .......... H03F 1/0227; H03F 2201/3233; H03F 2200/336; H03F 1/3241; H03F 3/45475; H03F 3/195; H03F 3/24; H03F 1/0222; H03F 1/56; H03F 2203/45526; H03F 2203/45528; H03F 2203/45638; H03F 2200/318; H03F 2203/45138; H03F 2203/45386; H03F 3/45179; H03F 1/0211; H03F 1/3258; H03F 1/3294; H03F 3/21; H03F 1/0233; H04B 17/14; H04B 1/0475; H04B 17/19; H04B 17/104; H04B 2001/0425; H04B 1/40; H04B 17/13; H04B 1/30; H04B 17/20; H04B 1/04; H04B 10/40; H04B 10/541; H04B 2001/0408; H04B 1/0458; H04B 1/707; H04B 1/713; H04B 17/101; H04B 2001/0433; H04B 1/38; H04B 2001/0416; H04B 1/1607; H04B 17/21; H04B 1/525; H04B 2001/0441; H04B 1/0003; H04B 1/0483; H04B 1/10; H04B 1/109; H04B 1/123; H03H 11/1291; H03H 2011/0494; H03H 21/0001; H03H 21/0012; H03H 11/126; H03H 11/22; H03H 11/344; H03H 7/42; H03H 2210/012; H03H 2210/015; H03H 2210/025; H03H 2210/028; H03H 11/1252; H03H 11/1256; H03H 11/30; H03H 2210/04; H03H 7/40; H03H 11/16

See application file for complete search history.

(56) References Cited

U.S. PATENT DOCUMENTS

| | | | |
|---|---|---|---|
| 7,683,713 | B2 | 3/2010 | Hongo |
| 7,859,338 | B2 | 12/2010 | Bajdechi et al. |
| 8,605,819 | B2 | 12/2013 | Lozhkin |
| 9,036,734 | B1 | 5/2015 | Mauer et al. |
| 9,065,504 | B2 | 6/2015 | Kwon et al. |
| 9,112,413 | B2 | 8/2015 | Barth et al. |
| 9,356,760 | B2 | 5/2016 | Larsson et al. |
| 9,438,196 | B2 | 9/2016 | Smith et al. |
| 9,560,595 | B2 | 1/2017 | Dakshinamurthy et al. |
| 9,692,366 | B2 | 6/2017 | Pilgram |
| 10,177,719 | B2 | 1/2019 | Gazneli et al. |
| 10,326,408 | B2 | 6/2019 | Khlat et al. |
| 11,088,660 | B2 | 8/2021 | Lin et al. |
| 11,387,789 | B2 | 7/2022 | Khlat et al. |
| 11,424,719 | B2 | 8/2022 | Khlat |
| 11,569,783 | B2 | 1/2023 | Nomiyama et al. |
| 2005/0100105 | A1 | 5/2005 | Jensen |
| 2006/0068710 | A1 | 3/2006 | Jensen |
| 2006/0209981 | A1 | 9/2006 | Kluesing et al. |
| 2008/0246550 | A1 | 10/2008 | Biedka et al. |
| 2009/0074106 | A1 | 3/2009 | See et al. |
| 2010/0298030 | A1 | 11/2010 | Howard |
| 2011/0182347 | A1 | 7/2011 | Cheung |
| 2012/0189081 | A1 | 7/2012 | Omoto et al. |
| 2012/0256688 | A1 | 10/2012 | Onishi |
| 2014/0065989 | A1 | 3/2014 | McLaurin |
| 2014/0084996 | A1 | 3/2014 | Schwent et al. |
| 2014/0105264 | A1 | 4/2014 | McLaurin et al. |
| 2014/0184337 | A1 | 7/2014 | Nobbe et al. |
| 2014/0213196 | A1 | 7/2014 | Langer et al. |
| 2014/0315504 | A1 | 10/2014 | Sakai et al. |
| 2016/0173030 | A1* | 6/2016 | Langer .................... H03F 3/245 330/250 |
| 2016/0182100 | A1 | 6/2016 | Menkhoff et al. |
| 2017/0005676 | A1* | 1/2017 | Yan .......................... H03F 3/24 |
| 2017/0338842 | A1 | 11/2017 | Pratt |
| 2018/0248570 | A1* | 8/2018 | Camuffo .................. H03F 3/19 |
| 2019/0296929 | A1 | 9/2019 | Milicevic et al. |
| 2019/0319583 | A1 | 10/2019 | El-Hassan et al. |
| 2019/0356285 | A1 | 11/2019 | Khlat et al. |
| 2020/0106392 | A1 | 4/2020 | Khlat et al. |
| 2020/0136563 | A1 | 4/2020 | Khlat |
| 2020/0295713 | A1 | 9/2020 | Khlat |
| 2020/0336111 | A1 | 10/2020 | Khlat |
| 2021/0194517 | A1 | 6/2021 | Mirea et al. |
| 2021/0281228 | A1 | 9/2021 | Khlat |
| 2021/0399690 | A1* | 12/2021 | Panseri .................... H03F 3/19 |
| 2022/0216834 | A1* | 7/2022 | Myoung ................. H03F 3/189 |
| 2022/0407462 | A1 | 12/2022 | Khlat |
| 2022/0407463 | A1 | 12/2022 | Khlat et al. |
| 2022/0407464 | A1 | 12/2022 | Khlat et al. |
| 2022/0407465 | A1 | 12/2022 | Khlat |
| 2022/0407478 | A1 | 12/2022 | Khlat et al. |
| 2023/0079153 | A1 | 3/2023 | Khlat |
| 2023/0080621 | A1 | 3/2023 | Khlat |
| 2023/0081095 | A1 | 3/2023 | Khlat |
| 2023/0082145 | A1 | 3/2023 | Lin et al. |
| 2023/0238927 | A1 | 7/2023 | Kay et al. |

FOREIGN PATENT DOCUMENTS

| | | |
|---|---|---|
| EP | 2705604 A2 | 3/2014 |
| EP | 2582041 B1 | 4/2018 |
| EP | 2232713 B1 | 10/2018 |
| EP | 3416340 A1 | 12/2018 |

OTHER PUBLICATIONS

Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.

Extended European Search Report for European Patent Application No. 22195695.6, dated Feb. 14, 2023, 12 pages.

Extended European Search Report for European Patent Application No. 22196188.1, dated Feb. 2, 2023, 25 pages.

U.S. Appl. No. 17/942,472, filed Sep. 12, 2022.
U.S. Appl. No. 17/939,350, filed Sep. 7, 2022.
U.S. Appl. No. 17/890,538, filed Aug. 18, 2022.
U.S. Appl. No. 17/939,372, filed Sep. 7, 2022.
U.S. Appl. No. 17/700,685, filed Mar. 22, 2022.
U.S. Appl. No. 17/689,232, filed Mar. 8, 2022.
U.S. Appl. No. 17/714,244, filed Apr. 6, 2022.
U.S. Appl. No. 17/700,700, filed Mar. 22, 2022.
U.S. Appl. No. 17/700,826, filed Mar. 22, 2022.

International Search Report and Written Opinion for International Patent Application No. PCT/US2023/060303, dated Apr. 11, 2023, 12 pages.

International Search Report and Written Opinion for International Patent Application No. PCT/US2022/043600, dated Jan. 11, 2023, 15 pages.

Non-Final Office Action for U.S. Appl. No. 17/942,472, dated Feb. 16, 2023, 13 pages.

Extended European Search Report for European Patent Application No. 22195382.1, dated Feb. 1, 2023, 26 pages.

Extended European Search Report for European Patent Application No. 22195683.2, dated Feb. 10, 2023, 12 pages.

Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/ content], 113 pages.

Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.

Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.

(56) References Cited

OTHER PUBLICATIONS

Extended European Search Report for European Patent Application No. 23153108.8, dated Jun. 20, 2023, 18 pages.
Advisory Action for U.S. Appl. No. 17/942,472, dated Sep. 15, 2023, 3 pages.
Notice of Allowance for U.S. Appl. No. 17/942,472, dated Oct. 18, 2023, 10 pages.
International Search Report and Written Opinion for International Patent Application No. PCT/US2023/019267, dated Aug. 3, 2023, 14 pages.
Final Office Action for U.S. Appl. No. 17/942,472, dated Jul. 19, 2023, 16 pages.
Paek, J.-S et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Williams, P., "Crossover Filter Shape Comparisons," White Paper, Linea Research, Jul. 2013, 13 pages.
Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.

* cited by examiner

200

┌─────────────────────────────────────────────────────────────────────┐
│ DETERMINE AND STORE A GAIN OFFSET LOOKUP TABLE (LUT) (72)           │
│ COMPRISING MULTIPLE GAIN OFFSET ENTRIES (76(1)-76(N)) EACH CONFIGURED│
│ TO CORRELATE A RESPECTIVE ONE OF MULTIPLE CALIBRATED FREQUENCIES ($F_1$-$F_N$) │
│ WITHIN A MODULATION BANDWIDTH WITH A RESPECTIVE ONE                 │
│ OF MULTIPLE GAIN OFFSETS ($\Delta G_1$-$\Delta G_N$)                │
│ 202                                                                 │
└─────────────────────────────────────────────────────────────────────┘
                                    ↓
┌─────────────────────────────────────────────────────────────────────┐
│ DETERMINE AND STORE A DELAY LUT (74) COMPRISING A PLURALITY         │
│ OF DELAY ENTRIES (78(1)-78(N)) EACH CONFIGURED TO CORRELATE A RESPECTIVE │
│ ONE OF THE MULTIPLE CALIBRATED FREQUENCIES ($F_1$-$F_N$)            │
│ WITH A RESPECTIVE ONE OF MULTIPLE FACTORS ($\tau_1$-$\tau_N$)       │
│ 204                                                                 │
└─────────────────────────────────────────────────────────────────────┘

DETERMINE A MINIMUM REFERENCE VOLTAGE ($V_{CC-REF}$) AND A MINIMUM REFERENCE INPUT POWER ($P_{IN-REF}$) BASED ON AN EFFICIENCY TARGET, A NOISE TARGET, AND/OR A LINEARITY TARGET OF A POWER AMPLIFIER CIRCUIT (36)
208

DETERMINE A REFERENCE FREQUENCY ($F_{REF}$) AMONG A PLURALITY OF CALIBRATED FREQUENCIES ($F_1$-$F_N$) WITHIN A MODULATION BANDWIDTH OF THE POWER AMPLIFIER CIRCUIT (36)
210

DETERMINE A REFERENCE TARGET VOLTAGE ($V_{TGT-REF}$) BASED ON AN EXPECTED ROOT-MEAN-SQUARE (RMS) OF A MODULATED VOLTAGE (VCC) TO BE PROVIDED TO THE POWER AMPLIFIER CIRCUIT (36) FOR AMPLIFYING A RADIO FREQUENCY (RF) SIGNAL (32)
212

SELECT A CALIBRATED FREQUENCY ($F_i$, $1 \leq i \leq N$) AMONG THE PLURALITY OF CALIBRATED FREQUENCIES ($F_1$-$F_N$) WITHIN THE MODULATION BANDWIDTH
214

DETERMINE A RESPECTIVE GAIN ($G_i$, $1 \leq i \leq N$) OF THE POWER AMPLIFIER CIRCUIT (36) THAT AMPLIFIES A TEST SIGNAL (82) GENERATED AT THE SELECTED CALIBRATED FREQUENCY ($F_i$) AND IN THE DETERMINED MINIMUM REFERENCE INPUT POWER ($P_{IN-REF}$) BASED ON THE DETERMINED MINIMUM REFERENCE VOLTAGE ($V_{CC-REF}$)
216

DETERMINE A RESPECTIVE MODULATED VOLTAGE ($V_{CCj}$, $1 \leq j \leq M$) AND A RESPECTIVE INPUT POWER ($P_{INj}$, $1 \leq j \leq M$) THAT CAUSE THE POWER AMPLIFIER CIRCUIT (36) TO HAVE THE RESPECTIVE GAIN ($G_i$) WHEN AMPLIFYING A RADIO FREQUENCY (RF) SIGNAL (32) AT THE SELECTED CALIBRATED FREQUENCY ($F_i$)
218

STORE THE RESPECTIVE MODULATED VOLTAGE ($V_{CCj}$) AND THE RESPECTIVE INPUT POWER ($P_{INj}$) IN A TEMPORARY VOLTAGE LOOK-UP TABLE (LUT)
220

EQUALIZATION FILTER CALIBRATION IN A TRANSCEIVER CIRCUIT

RELATED APPLICATIONS

This application claims the benefit of provisional patent application Ser. No. 63/245,139, filed Sep. 16, 2021, and provisional patent application Ser. No. 63/303,531, filed Jan. 27, 2022, the disclosures of which are hereby incorporated herein by reference in their entireties.

FIELD OF THE DISCLOSURE

The technology of the disclosure relates generally to a transmission circuit that transmits a radio frequency (RF) signal modulated in a wide modulation bandwidth.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on a higher data rate offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to higher power before transmission.

Envelope tracking (ET) is a power management technology designed to improve operating efficiency and/or linearity performance of the power amplifiers. In an ET power management circuit, a power management integrated circuit (PMIC) is configured to generate a time-variant ET voltage based on a time-variant voltage envelope of the RF signals, and the power amplifiers are configured to amplify the RF signals based on the time-variant ET voltage. Understandably, the better the time-variant ET voltage is aligned with the time-variant voltage envelope in time and amplitude, the better the performance (e.g., efficiency and/or linearity) that can be achieved at the power amplifiers. However, the time-variant ET voltage can become misaligned from the time-variant voltage envelope in time and/or amplitude due to a range of factors (e.g., group delay, impedance mismatch, etc.). As such, it is desirable to always maintain good alignment between the time-variant voltage and the time-variant voltage envelope and across a wide modulation bandwidth.

SUMMARY

Embodiments of the disclosure relate to equalization filter calibration in a transceiver circuit. The transceiver circuit generates a radio frequency (RF) signal(s) from a time-variant modulation vector and a power amplifier circuit(s) amplifies the RF signal(s) based on a modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted distortion in the RF signal(s). In this regard, the transceiver circuit is configured to apply an equalization filter to the time-variant modulation vector to thereby compensate for the voltage distortion filter at the output stage of the power amplifier circuit(s). In embodiments disclosed herein, a calibration circuit can be configured to calibrate the equalization filter across multiple frequencies within a modulation bandwidth of the power amplifier circuit to generate a gain offset lookup table (LUT) and a delay LUT. As a result, the equalization filter can be dynamically adapted to reduce undesired instantaneous excessive compression and/or spectrum regrowth resulting from the voltage distortion filter across the modulation bandwidth of the power amplifier circuit.

In one aspect, a transceiver circuit is provided. The transceiver circuit includes a memory circuit. The transceiver circuit also includes a calibration circuit. The calibration circuit is coupled to a power amplifier circuit. The calibration circuit is configured to determine and store a gain offset LUT in the memory circuit to correlate multiple calibrated frequencies within a modulation bandwidth of the power amplifier circuit with multiple gain offsets, respectively. The calibration circuit is also configured to determine and store a delay offset LUT in the memory circuit to correlate the multiple calibrated frequencies with multiple delay factors, respectively.

In another aspect, a method for calibrating an equalization filter in a transceiver circuit is provided. The method includes determining and storing a gain offset LUT to correlate a plurality of calibrated frequencies within a modulation bandwidth with a plurality of gain offsets, respectively. The method also includes determining and storing a delay offset LUT to correlate the plurality of calibrated frequencies with a plurality of delay factors, respectively.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 6 is a flowchart of an exemplary calibration process that can be employed by the transceiver circuit of FIG. 5 to calibrate the equalization filter;

DETAILED DESCRIPTION

Figure 1A:
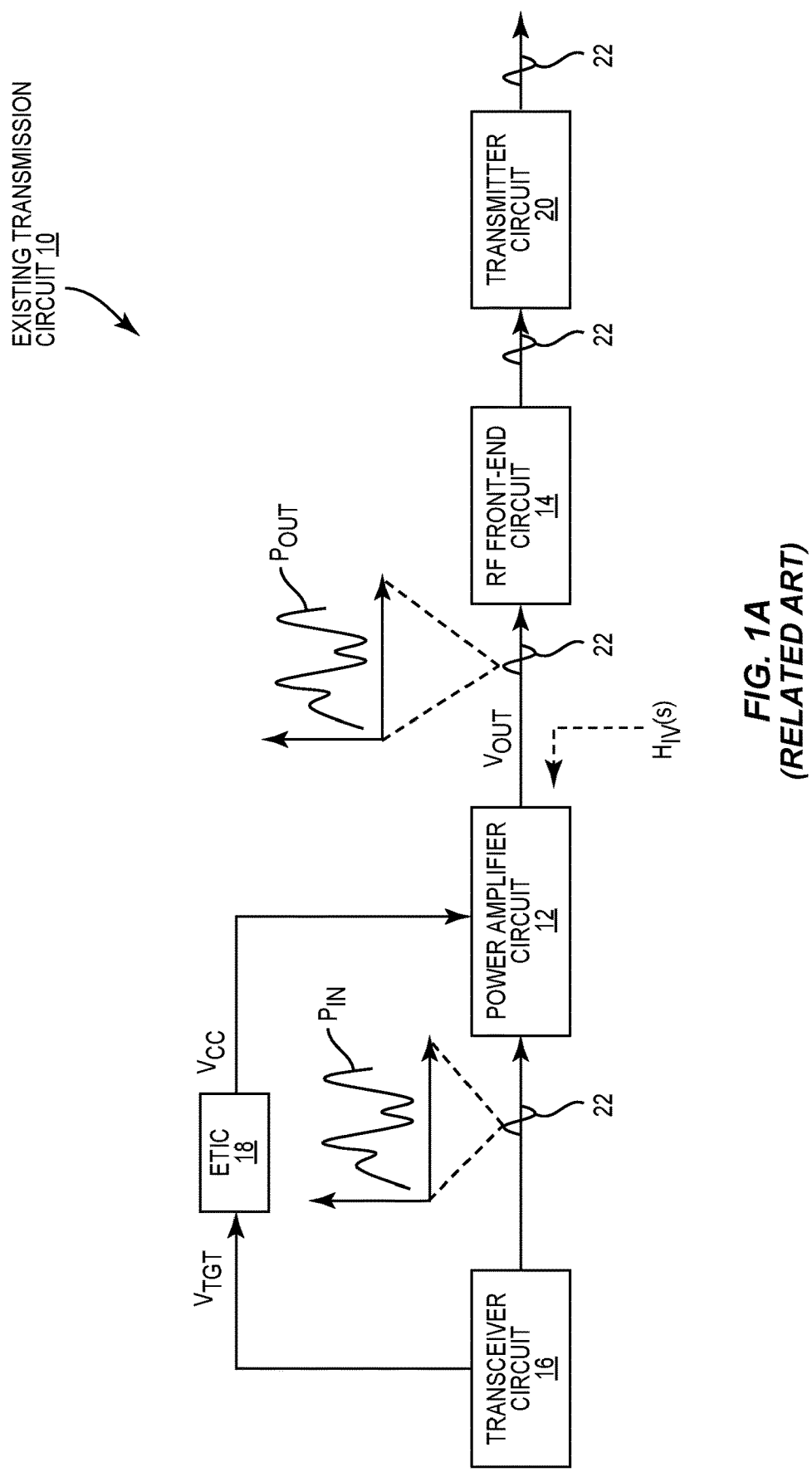
FIG. 1A is a schematic diagram of an exemplary existing transmission circuit, wherein an unwanted voltage distortion filter may be created on a power amplifier circuit when the power amplifier circuit is coupled to a radio frequency (RF) front-end circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to equalization filter calibration in a transceiver circuit. The transceiver circuit generates a radio frequency (RF) signal(s) based on a time-variant modulation vector and a power amplifier circuit(s) amplifies the RF signal(s) based on a modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted distortion in the RF signal(s). In this regard, the transceiver circuit is configured to apply an equalization filter to the time-variant modulation vector to thereby compensate for the voltage distortion filter at the output stage of the power amplifier circuit(s). In embodiments disclosed herein, a calibration circuit can be configured to calibrate the equalization filter across multiple frequencies within a modulation bandwidth of the power amplifier circuit to generate a gain offset lookup table (LUT) and a delay LUT. As a result, the equalization filter can be dynamically adapted to reduce undesired instantaneous excessive compression and/or spectrum regrowth resulting from the voltage distortion filter across the modulation bandwidth of the power amplifier circuit.

Figure 5:
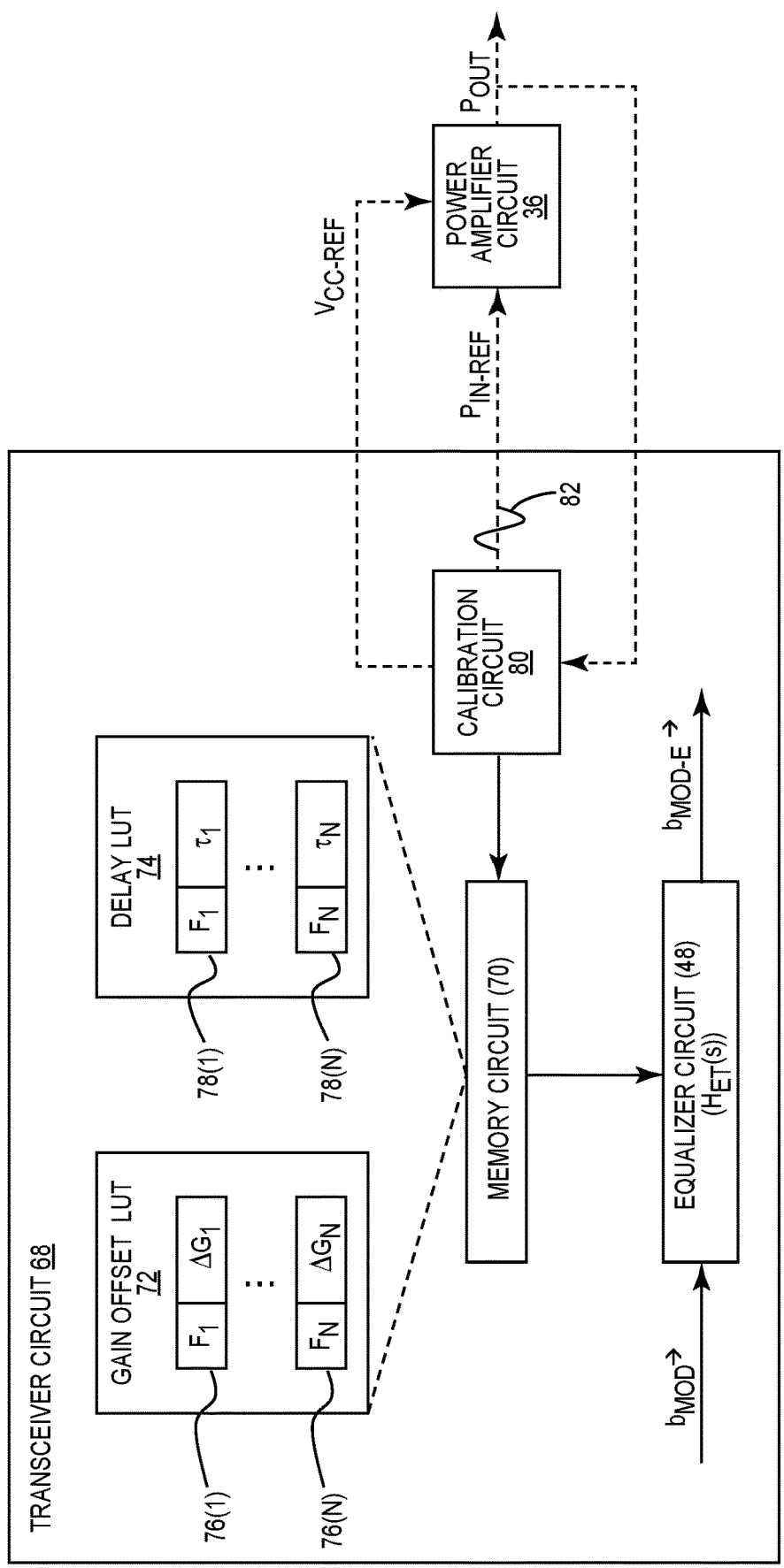
FIG. 5 is a schematic diagram of an exemplary transceiver circuit that can be configured according to embodiments of the present disclosure to calibrate the equalization filter across a modulation bandwidth of the transmission circuit of FIG. 3.

Before discussing the transceiver circuit and the calibration process according to the present disclosure, starting at FIG. 5, a brief discussion is first provided to help explain why there is a need to calibrate an equalization filter used in an existing transmission circuit for suppressing an unwanted voltage distortion filter.

FIG. 1A is a schematic diagram of an exemplary existing transmission circuit 10, wherein an unwanted voltage distortion filter $H_{IV}(s)$ presented to a power amplifier circuit 12 can cause a memory distortion in the power amplifier circuit 12 when the power amplifier circuit 12 is coupled to an RF front-end circuit 14. Notably, in the unwanted voltage distortion filter $H_{IV}(s)$, "s" is a notation of Laplace transform.

The existing transmission circuit 10 includes a transceiver circuit 16, an ETIC 18, and a transmitter circuit 20, which can include an antenna(s) (not shown) as an example. The transceiver circuit 16 is configured to generate an RF signal 22 having a time-variant input power $P_{IN}$ and provide the RF signal 22 to the power amplifier circuit 12. The transceiver circuit 16 is also configured to generate a time-variant target voltage $V_{TGT}$, which tracks the time-variant input power $P_{IN}$ of the RF signal 22. The ETIC 18 is configured to generate a modulated voltage $V_{CC}$ that tracks the time-variant target voltage $V_{TGT}$ and provides the modulated voltage $V_{CC}$ to the power amplifier circuit 12. Accordingly, the power amplifier circuit 12 can amplify the RF signal 22 to a time-variant output power $P_{OUT}$ as a function of a time-variant output voltage $V_{OUT}$. The power amplifier circuit 12 then provides the amplified RF signal 22 to the RF front-end circuit 14. The RF front-end circuit 14 may be a filter circuit that performs further frequency filtering on the amplified RF signal 22 before providing the amplified RF signal 22 to the transmitter circuit 20 for transmission.

Figure 1B:
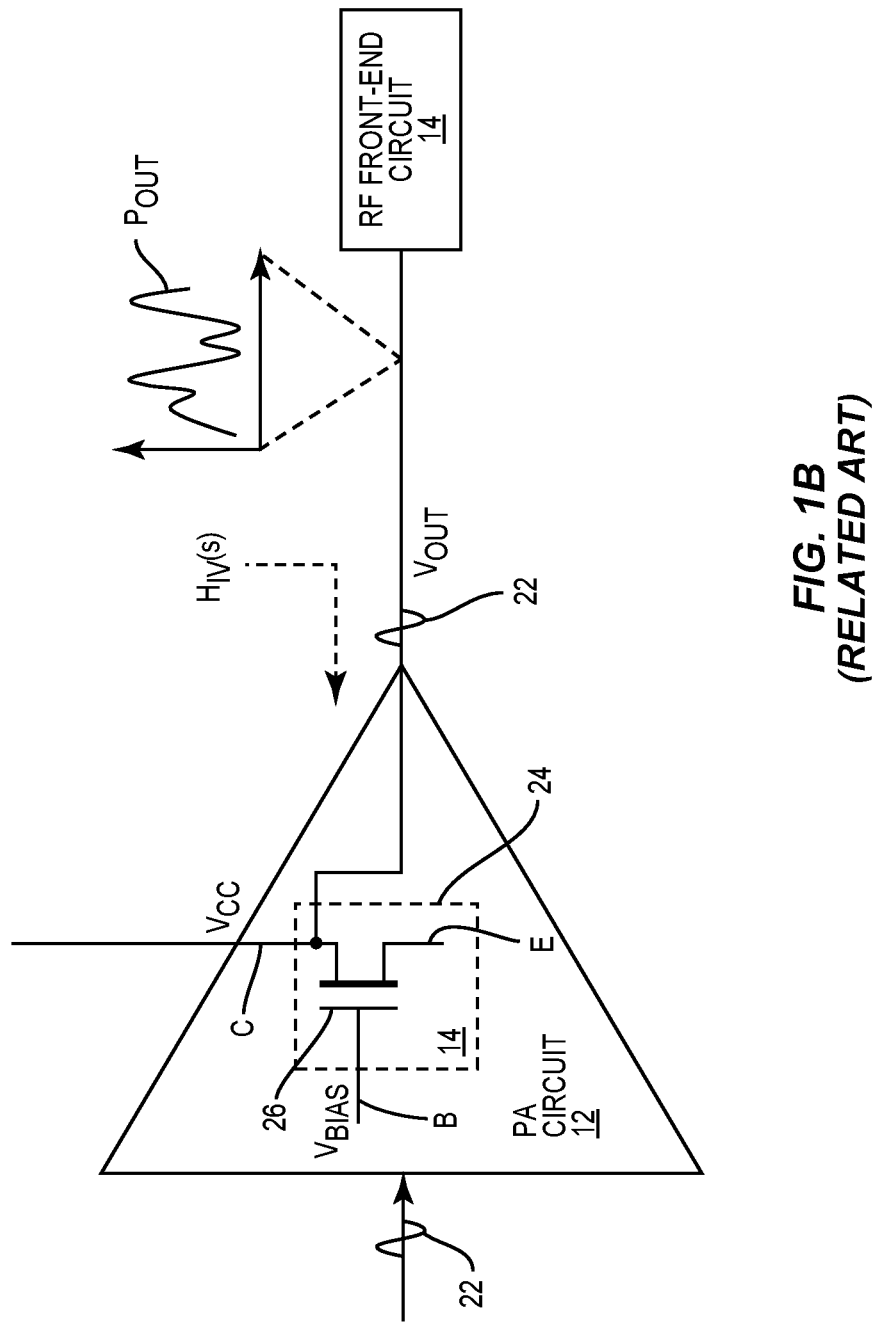
FIG. 1B is a schematic diagram providing an exemplary illustration of an output stage of the power amplifier circuit in FIG. 1A.

FIG. 1B is a schematic diagram providing an exemplary illustration of an output stage 24 of the power amplifier circuit 12 in FIG. 1A. Common elements between FIGS. 1A and 1B are shown therein with common element numbers and will not be re-described herein.

The output stage 24 can include at least one transistor 26, such as a bipolar junction transistor (BJT) or a complementary metal-oxide semiconductor (CMOS) transistor. Taking the BJT as an example, the transistor 26 can include a base electrode B, a collector electrode C, and an emitter electrode E. The base electrode B is configured to receive a bias voltage VBIAS and the collector electrode C is configured to receive the modulated voltage $V_{CC}$. The collector electrode C is also coupled to the RF front-end circuit 14 and configured to output the amplified RF signal 22 at the output voltage $V_{OUT}$. In this regard, the output voltage $V_{OUT}$ can be a function of the modulated voltage $V_{CC}$. Understandably, the power amplifier circuit 12 will operate with good efficiency and linearity when the time-variant modulated voltage $V_{CC}$ is aligned with the time-variant input power $P_{IN}$.

Figure 2:
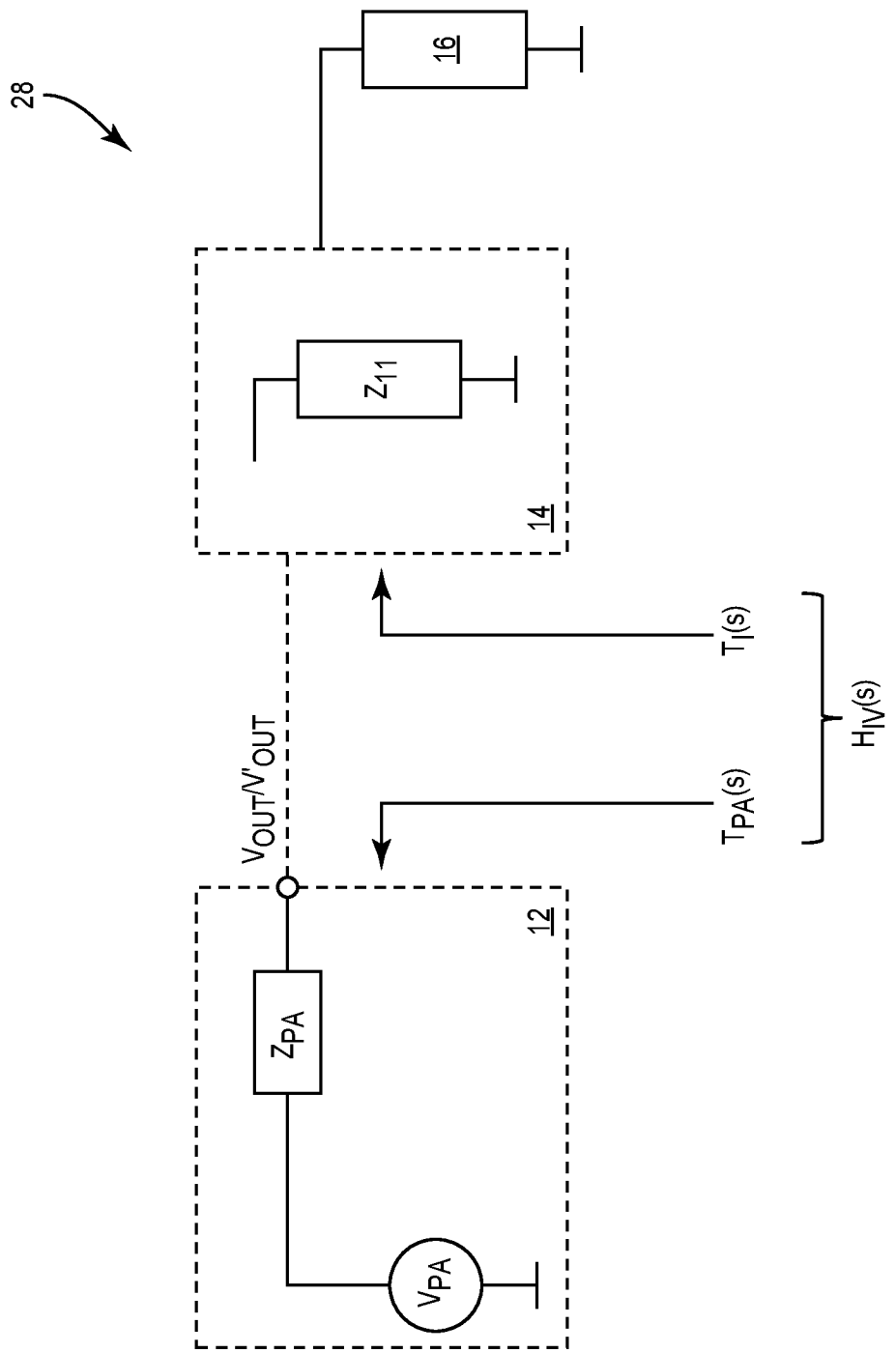
FIG. 2 is a schematic diagram of an exemplary equivalent model providing an exemplary illustration of the unwanted voltage distortion filter created by a coupling between the power amplifier circuit and the RF front-end circuit 14 in FIG. 1A.

FIG. 2 is a schematic diagram of an exemplary equivalent model 28 providing an exemplary illustration of the voltage distortion filter $H_{IV}(s)$ created by a coupling between the power amplifier circuit 12 and the RF front-end circuit 14 in the existing transmission circuit 10 of FIG. 1A. Elements in FIGS. 1A and 1B are referenced in FIG. 2 without being re-described herein.

In the equivalent model 28, $V_{PA}$ and $Z_{PA}$ represent the output stage 24 of the power amplifier circuit 12 and an inherent impedance of the power amplifier circuit 12, respectively, and $Z_{11}$ represents an inherent impedance associated with an input port of the RF front-end circuit 14. Herein, $V_{OUT}$ represents an output voltage associated with the RF signal 22 before the power amplifier circuit 12 is coupled to the RF front-end circuit 14, and $V'_{OUT}$ represents an output voltage associated with the RF signal 22 after the power amplifier circuit 12 is coupled to the RF front-end circuit 14. Hereinafter, the output voltages $V_{OUT}$ and $V'_{OUT}$ are referred to as "non-coupled output voltage" and "coupled output voltage," respectively, for distinction.

A Laplace transform representative of the coupled output voltage $V'_{OUT}$ can be expressed in equation (Eq. 1) below.

$$V'_{OUT}(s) = \frac{V_{OUT}(s)^*[1 - T_{PA}(s)]^*[1 + T_I(s)]}{2^*[1 - T_{PA}(s)^*T_I(s)]} = V_{OUT}(s)^* H_{IV}(s) \quad \text{(Eq. 1)}$$

$$H_{IV}(s) = \frac{[1 - T_{PA}(s)]^*[1 + T_I(s)]}{2^*[1 - T_{PA}(s)^*T_I(s)]}$$

In the equation (Eq. 1) above, $T_{PA}(s)$ represents a reflection coefficient looking back into the output stage 24 of the power amplifier circuit 12 and $T_I(s)$ represents a reflection coefficient looking into the RF front-end circuit 14. Notably, $T_{PA}(s)$ and $T_I(s)$ are complex filters containing amplitude and phase information. In this regard, the $T_{PA}(s)$, the $T_I(s)$, and, therefore, the voltage distortion filter $H_{IV}(s)$ are dependents of such factors as modulation bandwidth, RF spectrum, and/or voltage standing wave ratio (VSWR).

The equation (Eq. 1) shows that the coupled output voltage $V'_{OUT}$ will be altered from the non-coupled output voltage $V_{OUT}$ by the voltage distortion filter $H_{IV}(s)$ when the power amplifier circuit 12 is coupled to the RF front-end circuit 14. As a result, the coupled output voltage $V'_{OUT}$ may become misaligned from the modulated voltage $V_{CC}$, thus causing unwanted distortion in the RF signal 22.

Notably, it is possible to modify the modulated voltage $V_{CC}$ to compensate for the voltage distortion filter $H_{IV}(s)$ to thereby reduce or eliminate the difference between the non-coupled output voltage $V_{OUT}$ and the coupled output voltage $V'_{OUT}$. As a result, it is possible to reduce undesired instantaneous excessive compression and/or spectrum regrowth resulting from the voltage distortion filter $H_{IV}(s)$.

Figure 3:
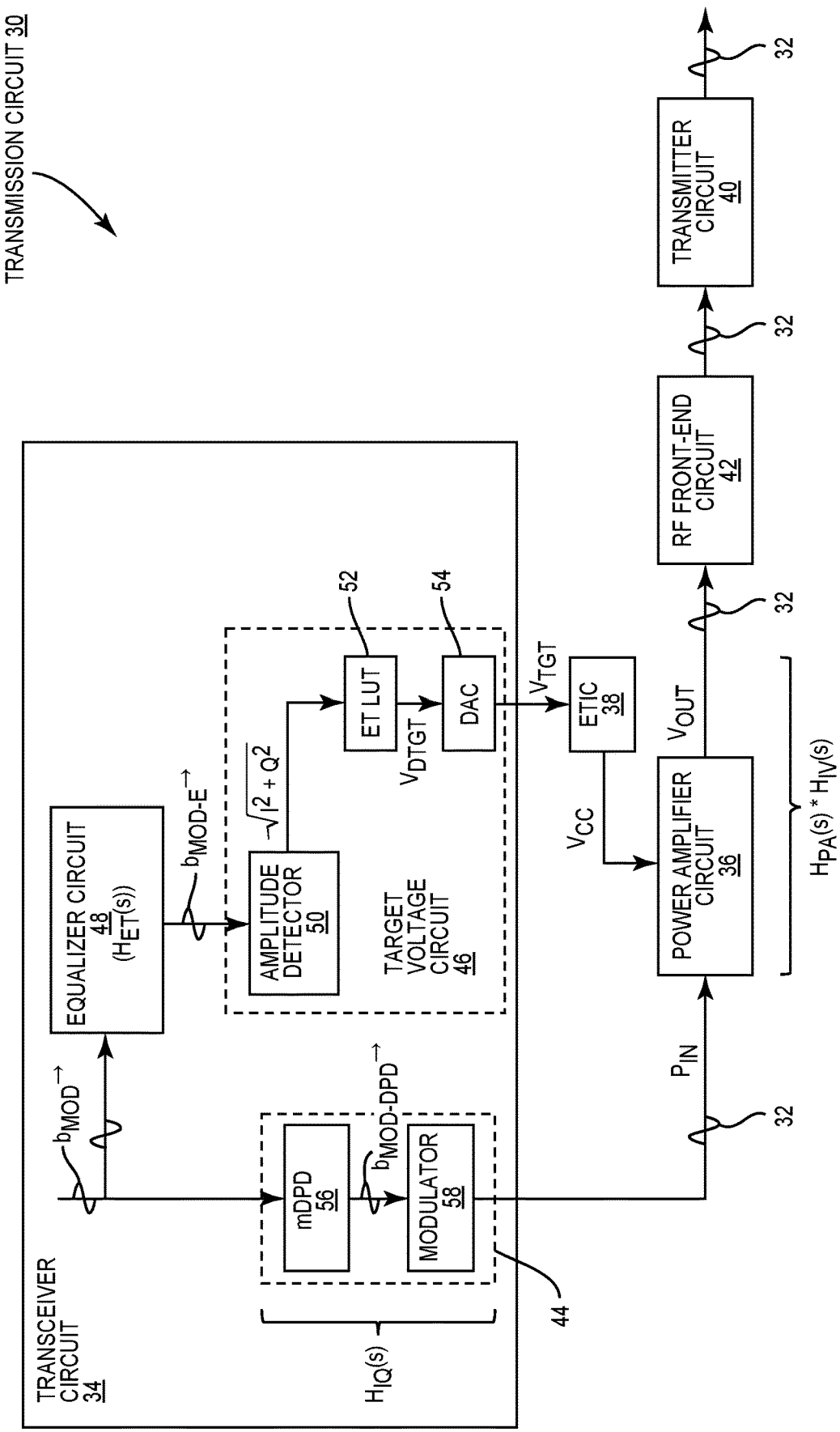
FIG. 3 is a schematic diagram of an exemplary transmission circuit configured to compensate for the unwanted voltage distortion filter in the existing transmission circuit of FIG. 1A based on an equalization filter.

In this regard, FIG. 3 is a schematic diagram of an exemplary transmission circuit 30 configured to compensate for the unwanted voltage distortion filter $H_{IV}(s)$ in the existing transmission circuit 10 of FIG. 1A based on an equalization filter $H_{ET}(s)$. The transmission circuit 30 is configured to transmit an RF signal 32 modulated in a wide range of modulation bandwidths. In a non-limiting example, the RF signal 32 can be modulated in a modulation bandwidth of 200 MHz or higher and transmitted in a millimeter wave RF spectrum.

The transmission circuit 30 includes a transceiver circuit 34, a power amplifier circuit 36, and an ETIC 38. The power amplifier circuit 36 is coupled to a transmitter circuit 40 via an RF front-end circuit 42. In a non-limiting example, the RF front-end circuit 42 can include one or more of a filter circuit and a multiplexer circuit (not shown). The filter circuit may be configured to include a filter network, such as an acoustic filter network with a sharp cutoff frequency. The power amplifier circuit 36 may be identical to or functionally equivalent to the power amplifier circuit 12 in FIG. 1B. As such, the power amplifier circuit 36 may also include the output stage 24 as in the power amplifier circuit 12.

The transceiver circuit 34 includes a signal processing circuit 44 and a target voltage circuit 46. The signal processing circuit 44 is configured to generate the RF signal 32 from a time-variant modulation vector $\vec{b_{MOD}}$. The time-variant modulation vector $\vec{b_{MOD}}$ may be generated by a digital baseband circuit (not shown) in the transceiver circuit 34 and includes both in-phase (I) and quadrature (Q) components. The target voltage circuit 46 is configured to detect a time-variant amplitude envelope $\sqrt{I^2+Q^2}$ of the RF signal 32 from the time-variant modulation vector $\vec{b_{MOD}}$. Accordingly, the target voltage circuit 46 can generate a modulated target voltage $V_{TGT}$ based on the detected time-variant amplitude envelope $\sqrt{I^2+Q^2}$.

The ETIC 38 is configured to generate a modulated voltage $V_{CC}$ based on the modulated target voltage $V_{TGT}$ and provide the modulated voltage $V_{CC}$ to the power amplifier circuit 36. The power amplifier circuit 36, in turn, amplifies the RF signal 32 to an output voltage $V_{OUT}$ based on the modulated voltage $V_{CC}$ for transmission via the RF front-end circuit 42 and the transmitter circuit 40.

As previously described, the output voltage $V_{OUT}$ is a function of the modulated voltage $V_{CC}$. In this regard, it is possible to reduce or even eliminate the difference between the non-coupled output voltage $V_{OUT}$ and the coupled output voltage $V'_{OUT}$ by generating the modulated voltage $V_{CC}$ to compensate for the voltage distortion filter $H_{IV}(s)$. Given that the ETIC 38 is configured to generate the modulated voltage $V_{CC}$ based on the modulated target voltage $V_{TGT}$, it is thus possible to reduce or even eliminate the difference between the non-coupled output voltage $V_{OUT}$ and the coupled output voltage $V'_{OUT}$ by generating the modulated target voltage $V_{TGT}$ to compensate for the voltage distortion filter $H_{IV}(s)$.

In this regard, the transceiver circuit 34 further includes an equalizer circuit 48. The equalizer circuit 48 is configured to apply the equalization filter $H_{ET}(s)$ to the time-variant modulation vector $\vec{b}_{MOD}$ prior to the target voltage circuit 46 generating the modulated target voltage $V_{TGT}$. In an embodiment, the equalization filter $H_{ET}(s)$ can be described by equation (Eq. 2) below.

$$H_{ET}(s)=H_{IQ}(s)*H_{PA}(s)*H_{IV}(s) \quad (Eq. 2)$$

In the equation (Eq. 2) above, $H_{IQ}(s)$ represents a transfer function of the signal processing circuit 44 and $H_{PA}(s)$ represents a voltage gain transfer function of the power amplifier circuit 36. In this regard, the equalization filter $H_{ET}(s)$ is configured to match a combined signal path filter that includes the transfer function $H_{IQ}(s)$, the voltage gain transfer function $H_{PA}(s)$, and the voltage distortion filter $H_{IV}(s)$.

In an embodiment, the equalizer circuit 48 applies the equalization filter $H_{ET}(s)$ to the time-variant modulation vector $\vec{b}_{MOD}$ to generate an equalized time-variant modulation vector $\vec{b}_{MOD-E}$ and provides the equalized time-variant modulation vector $\vec{b}_{MOD-E}$ to the target voltage circuit 46. The target voltage circuit 46, in turn, detects the time-variant amplitude envelope $\sqrt{I^2+Q^2}$ from the equalized time-variant modulation vector $\vec{b}_{MOD-E}$ and generates the modulated target voltage $V_{TGT}$ based on the detected time-variant amplitude envelope $\sqrt{I^2+Q^2}$. Since the modulated target voltage $V_{TGT}$ is generated from the equalized time-variant modulation vector $\vec{b}_{MOD-E}$, the modulated target voltage $V_{TGT}$, and therefore the modulated voltage $V_{CC}$, will be able to compensate for the voltage distortion filter $H_{IV}(s)$, which is created on the output stage 24 of the power amplifier circuit 36 by coupling the power amplifier circuit 36 with the RF front-end circuit 42.

In an embodiment, the target voltage circuit 46 includes an amplitude detector circuit 50, an ET LUT circuit 52, and a digital-to-analog converter (DAC) 54. The amplitude detector circuit 50 is configured to detect the time-variant amplitude envelope $\sqrt{I^2+Q^2}$ from the equalized time-variant modulation vector $\vec{b}_{MOD-E}$. The ET LUT circuit 52, which can include an isogain LUT (not shown) correlating the time-variant amplitude envelope $\sqrt{I^2+Q^2}$ with various level of voltages, is configured to generate a time-variant digital target voltage $V_{DTGT}$ based on the detected time-variant amplitude envelope $\sqrt{I^2+Q^2}$. The DAC 54 is configured to convert the time-variant digital target voltage $V_{DTGT}$ into the modulated target voltage $V_{TGT}$ and provide the modulated target voltage $V_{TGT}$ to the ETIC 38.

In an embodiment, the signal processing circuit 44 can include a memory digital predistortion (mDPD) circuit 56 and a modulator circuit 58. The mDPD circuit 56 is configured to receive the time-variant modulation vector $\vec{b}_{MOD-E}$ and digitally pre-distort the time-variant modulation vector $\vec{b}_{MOD-E}$ to generate a pre-distorted time-variant modulation vector $\vec{b}_{MOD-DPD}$. The modulator circuit 58 is configured to generate the RF signal 32 from the pre-distorted time-variant modulation vector $\vec{b}_{MOD-DPD}$ and provide the RF signal 32 to the power amplifier circuit 36.

As mentioned earlier, the RF signal 32 may be modulated in a wide range of modulation bandwidth. Herein, a modulation bandwidth refers to a range of RF frequencies that the RF signal 32 may be modulated onto and/or the transmission circuit 30 is configured to handle. For example, if the RF signal 32 can be modulated between 2554 MHz and 2654 MHz, the modulation bandwidth will then be 100 MHz and a center frequency ($F_C$) of the modulation bandwidth will be at 2604 MHz. Accordingly, any other frequencies within the modulation bandwidth will be regarded as non-center frequencies ($F_{NC}$) (2554 MHz≤$F_{NC}$≤2604 MHz and 2604 MHz<$F_{NC}$≤2654 MHz). Hereinafter, the modulation bandwidth of the RF signal 32 is referred to interchangeably as the modulation bandwidth of the transmission circuit 30.

In this regard, the equalization filter $H_{ET}(s)$ needs to suppress the voltage distortion filter $H_{IV}(s)$ across the entire modulation bandwidth. However, as the isogain LUT in the ET LUT circuit 52 is typically determined based on a center frequency within the modulation bandwidth, the isogain LUT in the ET LUT circuit 52 may not be able provide a constant isogain for all other frequencies within the modulation bandwidth. Accordingly, the equalization filter $H_{ET}(s)$ must be calibrated to ensure that the isogain LUT determined based on the center frequency can provide a constant isogain across all the frequencies within the modulation bandwidth.

Figure 4B:
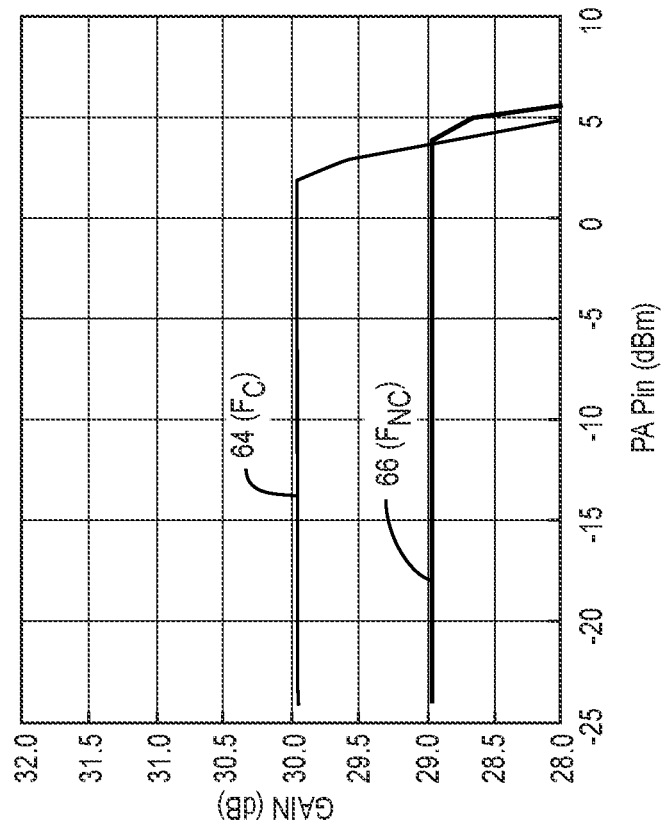
FIGS. 4A-4C are graphic diagrams providing exemplary illustrations as to why the equalization filter in FIG. 3 must be calibrated across a modulation bandwidth of the transmission circuit.
Figure 4A:
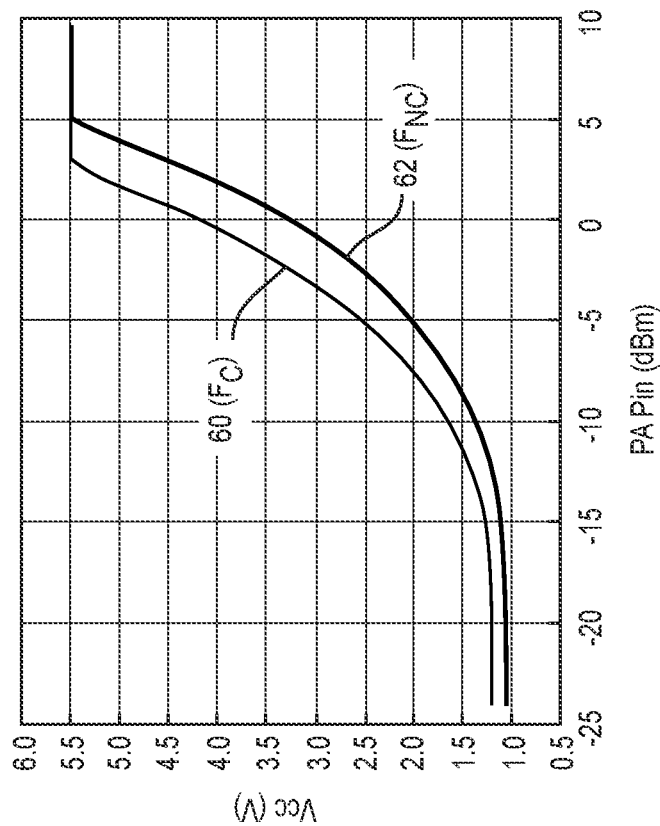
Figure 4C:
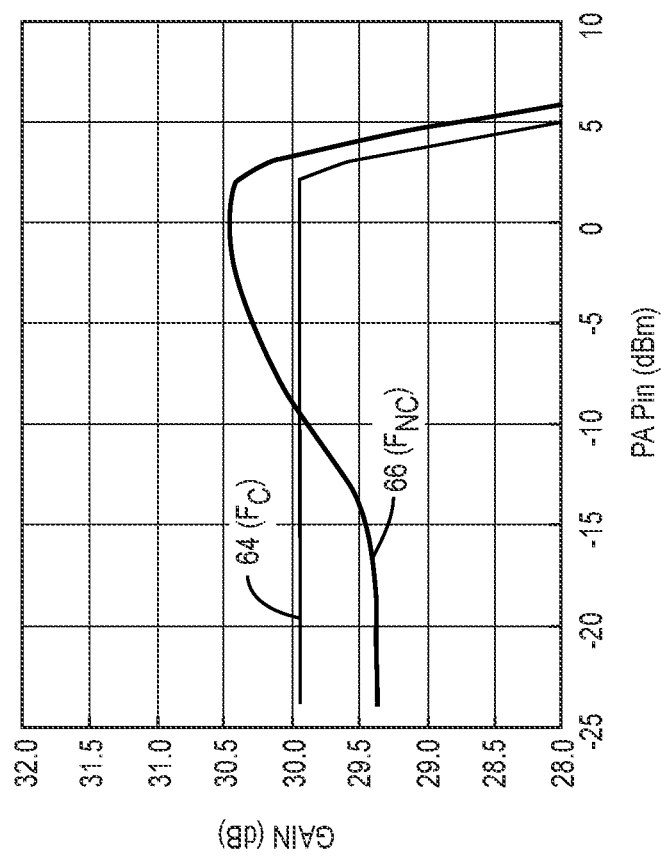

FIGS. 4A-4C are graphic diagrams providing exemplary illustrations as to why the equalization filter $H_{ET}(s)$ in FIG. 3 must be calibrated across a modulation bandwidth of the transmission circuit 30. Common elements between FIGS. 4A-4C are shown therein with common element numbers and will not be re-described herein.

FIG. 4A illustrates a center-frequency LUT 60 corresponding to a center frequency $F_C$ within the modulation bandwidth of the transmission circuit 30 and a non-center-frequency LUT 62 corresponding to a non-center frequency $F_{NC}$ within the modulation bandwidth of the transmission circuit 30.

FIG. 4B illustrates a center-frequency gain 64 provided by the center-frequency LUT 60 and a non-center-frequency gain 66 provided by the non-center-frequency LUT 62. As illustrated, the center-frequency LUT 60 can provide a 30 dB constant gain when the RF signal 32 is modulated at the center frequency $F_C$ and has the input power $P_{IN}$ between −25 dBm and 3 dBm for the center frequency $F_C$. The non-center-frequency LUT 62, on the other hand, can provide a 29 dB constant gain when the RF signal 32 is modulated at the non-center frequency $F_{NC}$ and has the input power $P_{IN}$ between −25 dBm and 4 dBm. In this regard, if the ET LUT circuit 52 employs both the center-frequency LUT 60 and the non-center-frequency LUT 62, it will be possible to achieve constant gains when the RF signal 32 is modulated at both the center frequency $F_C$ and the non-center frequency $F_{NC}$.

However, when the ET LUT circuit 52 employs only the center-frequency LUT 60, the non-center-frequency LUT 62 would not be able to maintain the 29 dB constant gain at the non-center-frequency $F_{NC}$. As illustrated in FIG. 4C, the center-frequency LUT 60 in FIG. 4A provides a varying gain from 29.4 dB to 30.5 dB between −25 dBm and +2 dBm but does not provide 29 dB constant gain when the RF signal 32 is modulated at the non-center-frequency $F_{NC}$. Hence, it is desirable to calibrate the equalization filter $H_{ET}(s)$ to ensure that the center-frequency LUT 60 can provide a constant gain across center and non-center frequencies within the modulation bandwidth of the RF signal 32.

In this regard, FIG. 5 is a schematic diagram of an exemplary transceiver circuit 68 that can be configured according to embodiments of the present disclosure to calibrate the equalization filter $H_{ET}(s)$ across a modulation bandwidth of the transmission circuit of FIG. 3. Common elements between FIGS. 3 and 5 are shown therein with common element numbers and will not be re-described herein. In an embodiment, the transceiver circuit 68 may be employed in the transmission circuit 30 to replace the transceiver circuit 34.

In an embodiment, the transceiver circuit 68 includes a memory circuit 70. The memory circuit 70, which can include such storage circuits as random-access memory (RAM), flash storage, solid-state disk (SSD), as an example, is configured to store a gain offset LUT 72 and a delay LUT 74. In a non-limiting example, the gain offset LUT 72 includes multiple gain offset entries 76(1)-76(N), each configured to correct a respective one of multiple calibrated frequencies $F_1$-$F_N$ within the modulation bandwidth with a respective one of multiple gain offsets $\Delta G_1$-$\Delta G_N$. Herein, the calibrated frequencies $F_1$-$F_N$ include all the non-center frequencies ($F_{NC}$) and the center frequency ($F_C$) within the modulation bandwidth. In another non-limiting example, the delay LUT 74 includes multiple delay entries 78(1)-78(N), each configured to correlate a respective one of the calibrated frequencies $F_1$-$F_N$ with a respective one of multiple delay factors $\tau_1$-$\tau_N$.

In an embodiment, the transceiver circuit 68 can be configured to include a calibration circuit 80, which can be a field-programmable gate array (FPGA), as an example. Although the calibration circuit 80, as illustrated herein, is provided inside the transceiver circuit 68, it should be appreciated that the calibration circuit 80 can be separated from the transceiver circuit 68 but coupled to the transceiver circuit 68 via, for example, a general-purpose input/output (GPIO) interface. As discussed below, the calibration circuit 80 can be configured to determine and populate the gain offset LUT 72 and the delay LUT 74 such that the equalization filter $H_{ET}(s)$ can be calibrated to cause the ET LUT circuit 52 to provide a constant gain across all the calibrated frequencies $F_1$-$F_N$ based on, for example, the center-frequency LUT 60 in FIG. 4A.

The calibration circuit 80 may be configured to calibrate the equalization filter $H_{ET}(s)$ based on a process. In this regard, FIG. 6 is a flowchart of an exemplary calibration process 200 that can be employed by the calibration circuit 80 in the transceiver circuit 68 of FIG. 5 to calibrate the equalization filter $H_{ET}(s)$.

Herein, the calibration circuit 80 is first configured to determine and store the gain offset LUT 72 that includes the gain offset entries 76(1)-76(N), with each of the gain offset entries 76(1)-76(N) configured to correlate a respective one of the calibrated frequencies $F_1$-$F_N$ within the modulation bandwidth with a respective one of the gain offsets $\Delta G_1$-$\Delta G_N$ (step 202). Next, the calibration circuit 80 is configured to determine and store the delay LUT 74 that includes the delay entries 78(1)-78(N), with each of the delay entries 78(1)-78(N) configured to correlate a respective one of the calibrated frequencies $F_1$-$F_N$ with a respective one of the delay factors $\tau_1$-$\tau_N$ (step 204).

Figure 7:
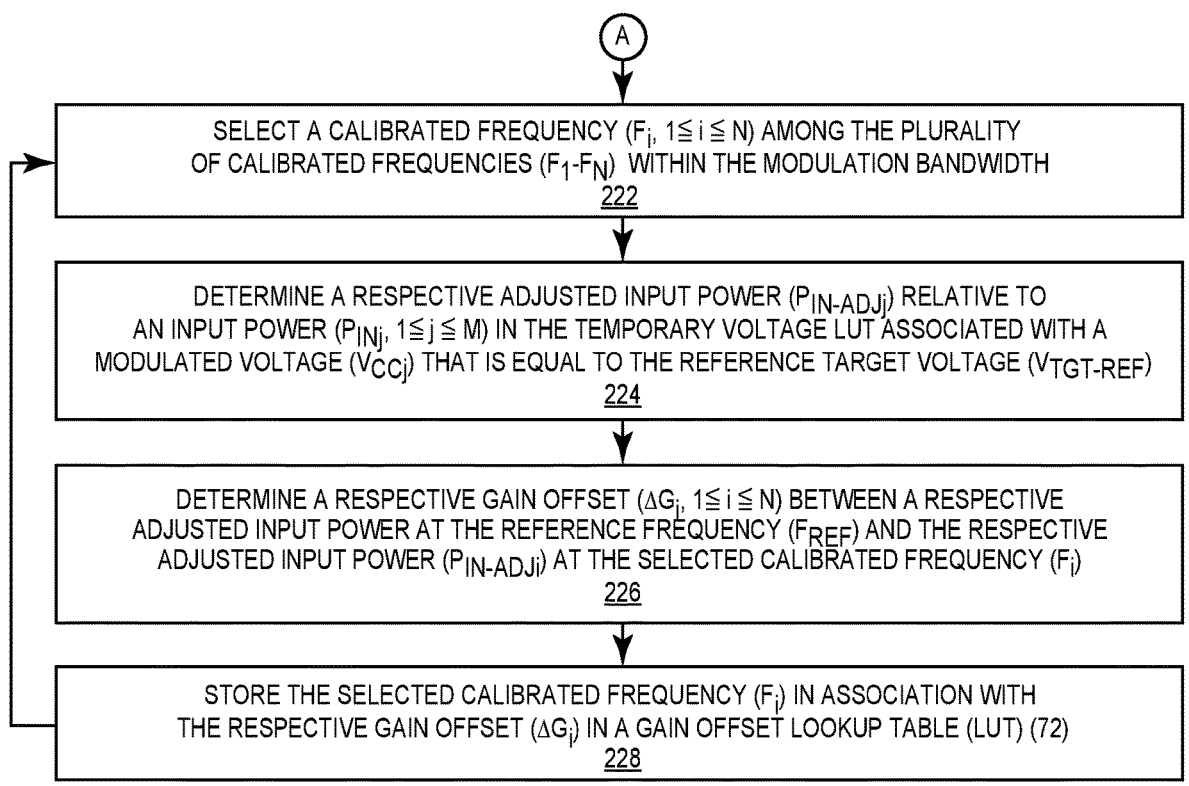
FIG. 7 is a flowchart of an exemplary process that can be employed by the transceiver circuit of FIG. 5 to determine a gain offset lookup table (LUT) as part of the calibration process of FIG. 6.

In an embodiment, the calibration circuit 80 may determine and store the gain offset LUT 72 (step 202) in the memory circuit 70 based on a process. In this regard, FIG. 7 is a flowchart of an exemplary process 206 that can be employed by the calibration circuit 80 in the transceiver circuit 68 of FIG. 5 to determine the gain offset LUT 72 as part of the calibration process 200 of FIG. 6. Elements in FIG. 5 are referenced in conjunction with the discussion of FIG. 7 and will not be re-described herein.

Herein, the calibration circuit 80 is configured to determine a minimum reference voltage $V_{CC-REF}$ and a minimum reference input power $P_{IN-REF}$ based on an efficiency target, a noise target, and/or a linearity target of the power amplifier circuit 36 (step 208). In other words, the minimum reference voltage $V_{CC-REF}$ and the minimum reference input power $P_{IN-REF}$ can be determined empirically to achieve a desired trade-off between the efficiency target, the noise target, and/or the linearity target of the power amplifier circuit 36. Although the calibration circuit 80 is configured herein to determine a minimum reference input power $P_{IN-REF}$, it should be appreciated that it is also possible to replace the input power $P_{IN-REF}$ with a corresponding output power.

The calibration circuit 80 then determines a reference frequency FREF among the calibrated frequencies $F_1$-$F_N$ within the modulation bandwidth of the power amplifier circuit 36 (step 210). In a non-limiting example, the reference frequency FREF can be the center frequency $F_C$ among the calibrated frequencies $F_1$-$F_N$.

Next, the calibration circuit 80 determines a reference target voltage ($V_{TGT-REF}$) based on an expected root-mean-square (RMS) of the modulated voltage $V_{CC}$ (e.g., 2.5 V) to be provided to the power amplifier circuit 36 for amplifying the RF signal 32 in the transmission circuit 30 of FIG. 3 (step 212).

Next, the calibration circuit 80 selects a calibrated frequency $F_i$ among the calibrated frequencies $F_1$-$F_N$ within the modulation bandwidth (step 214). The calibration circuit 80 then determines a respective gain $G_i$ of the power amplifier circuit 36 when the power amplifier circuit 36 amplifies a test signal 82 that is generated at the selected calibrated frequency $F_i$ and in the minimum reference input power $P_{IN-REF}$ based on the minimum reference voltage $V_{CC-REF}$ (step 216). Notably, the test signal 82 may be generated by the calibration circuit 80 or a separate signal generator (not shown). In a non-limiting example, the calibration circuit 80 can measure an output power $P_{OUT}$ of the power amplifier circuit 36 and determine the respective reference gain $G_{REF}$ based on the measured output power $P_{OUT}$ and the determined minimum reference input power $P_{IN-REF}$. Subsequently, the calibration circuit 80 can determined a respective modulated voltage $V_{CCj}$ ($1 \leq j \leq M$) and a respective input power $P_{INj}$ ($1 \leq j \leq M$) that can cause the power amplifier circuit 36 to have the respective gain $G_i$ when amplifying the RF signal 32 at the selected calibrated frequency $F_i$ (step 218). Herein, M may be identical to or different from N. Accordingly, the calibration circuit 80 can store the respective modulated voltage $V_{CCj}$ and the respective input power $P_{INj}$ in a temporary voltage LUT (not shown) in the memory circuit 70 (step 220). The calibration circuit 80 is configured to repeat steps 214-220 for each of the calibrated frequencies $F_1$-$F_N$.

With continuing reference to FIG. 7, the calibration circuit 80 again selects a calibrated frequency $F_i$ (1≤i≤N) among the calibrated frequencies $F_1$-$F_N$ within the modulation bandwidth (step 222). The calibration circuit 80 then determines a respective adjusted input power $P_{IN\text{-}ADJi}$ (1≤i≤N) relative to an input power $P_{INj}$ (1≤j≤M) in the temporary voltage LUT associated with a modulated voltage $V_{CCj}$ that is equal to the reference target voltage $V_{TGT\text{-}REF}$ (step 224). Subsequently, the calibration circuit 80 determines a respective gain offset $\Delta G_i$ (1≤i≤N) between a respective adjusted input power at the reference frequency FREF and the respective adjusted input power $P_{IN\text{-}ADJi}$ at the selected calibrated frequency $F_i$ (step 226). The calibration circuit 80 then stores the selected calibrated frequency Fi in association with the respective gain offset $\Delta G_i$ in the gain offset LUT 72 (step 228). Notably, the calibration circuit 80 is configured to repeat steps 222-228 for each of the calibrated frequencies $F_1$-$F_N$.

Figure 8B:
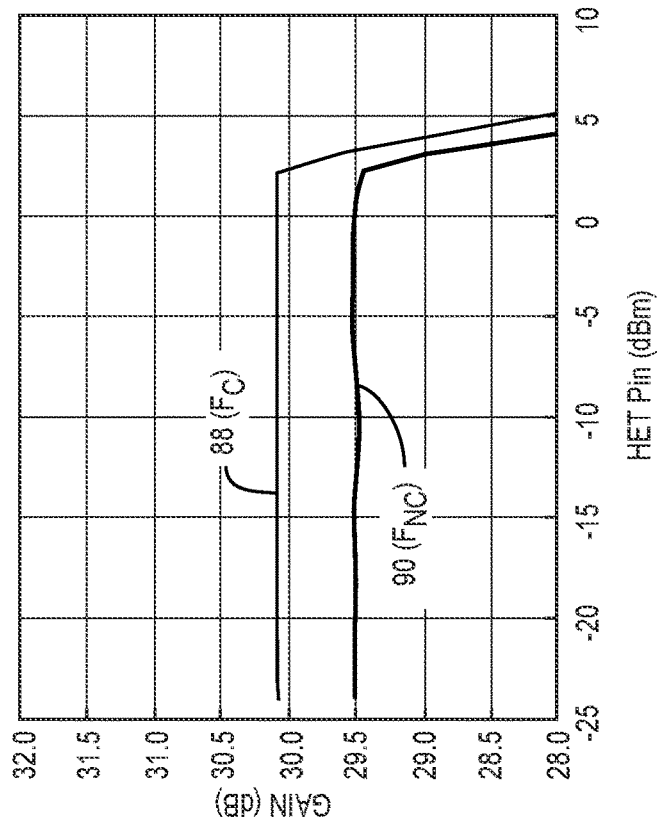
FIGS. 8A-8B are graphic diagrams illustrating impacts of the equalization filter calibration as performed based on the processes of FIGS. 6 and 7.
Figure 8A:
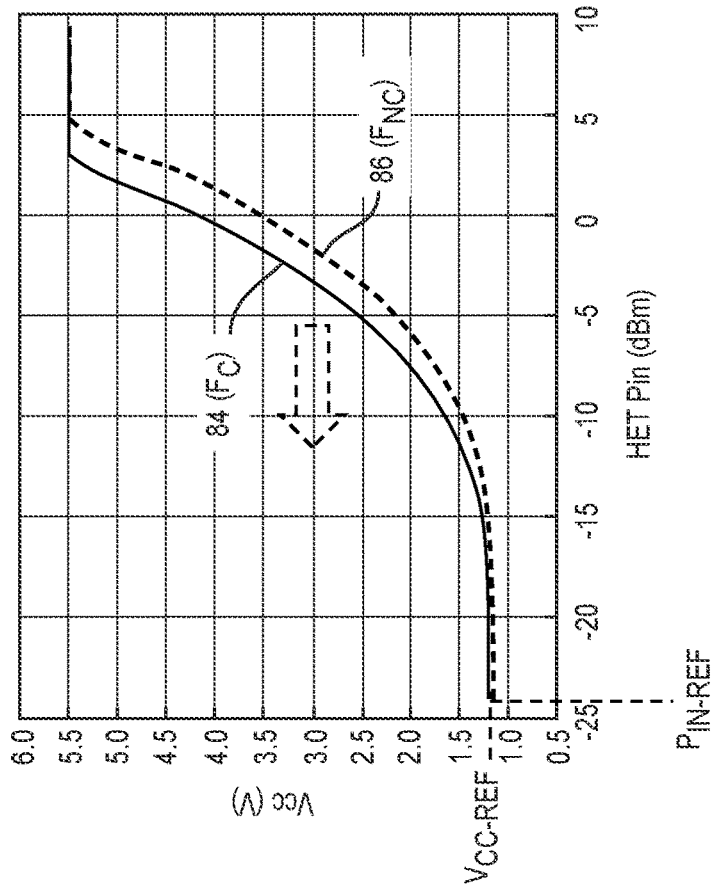

With reference back to FIG. 5, for each of the calibrated frequencies $F_1$-$F_N$, the equalizer circuit 48 is configured to generate the equalization filter $H_{ET}(s)$ based on the gain offset LUT 72 and apply the equalization filter $H_{ET}(s)$ to the time-variant modulation vector $\vec{b_{MOD}}$ to generate the equalized time-variant modulation vector $\vec{b_{MOD\text{-}E}}$. FIGS. 8A-8B are graphic diagrams illustrating an impact of the equalization filter calibration as performed based on the process 200 of FIG. 6 and the process 206 of FIG. 7.

FIG. 8A illustrates a center-frequency LUT 84 corresponding to a center frequency $F_C$ among the calibrated frequencies $F_1$-$F_N$ and a non-center-frequency LUT 86 corresponding to a non-center frequency $F_{NC}$ among the calibrated frequencies $F_1$-$F_N$. Notably, both the center-frequency LUT 84 and the non-center-frequency LUT 86 are both based on the same minimum reference voltage $V_{CC\text{-}REF}$ and the same minimum reference input power $P_{IN\text{-}REF}$. The center-frequency LUT 84 will be stored in the ET LUT circuit 52 in the transmission circuit 30 for generating the time-variant digital target voltage $V_{DTGT}$ from the detected time-variant amplitude envelope $\sqrt{I^2+Q^2}$. The non-center-frequency LUT 86, on the other hand, is not stored in the ET LUT circuit 52 and can be seen as a "virtual" LUT. The equalization filter $H_{ET}(s)$ can use a corresponding gain offset $\Delta G_i$ (1≤i≤N) of the non-center frequency $F_{NC}$ to superimpose the non-center-frequency LUT 86 on the center-frequency LUT 84. As can be visualized in FIG. 8A, it is equivalent to left-shifting the non-center-frequency LUT 86 to overlap with the center-frequency LUT 84. As a result, as illustrated in FIG. 8B, a center-frequency gain 88 and a non-center-frequency gain 90 are both relatively constant.

Figure 9:
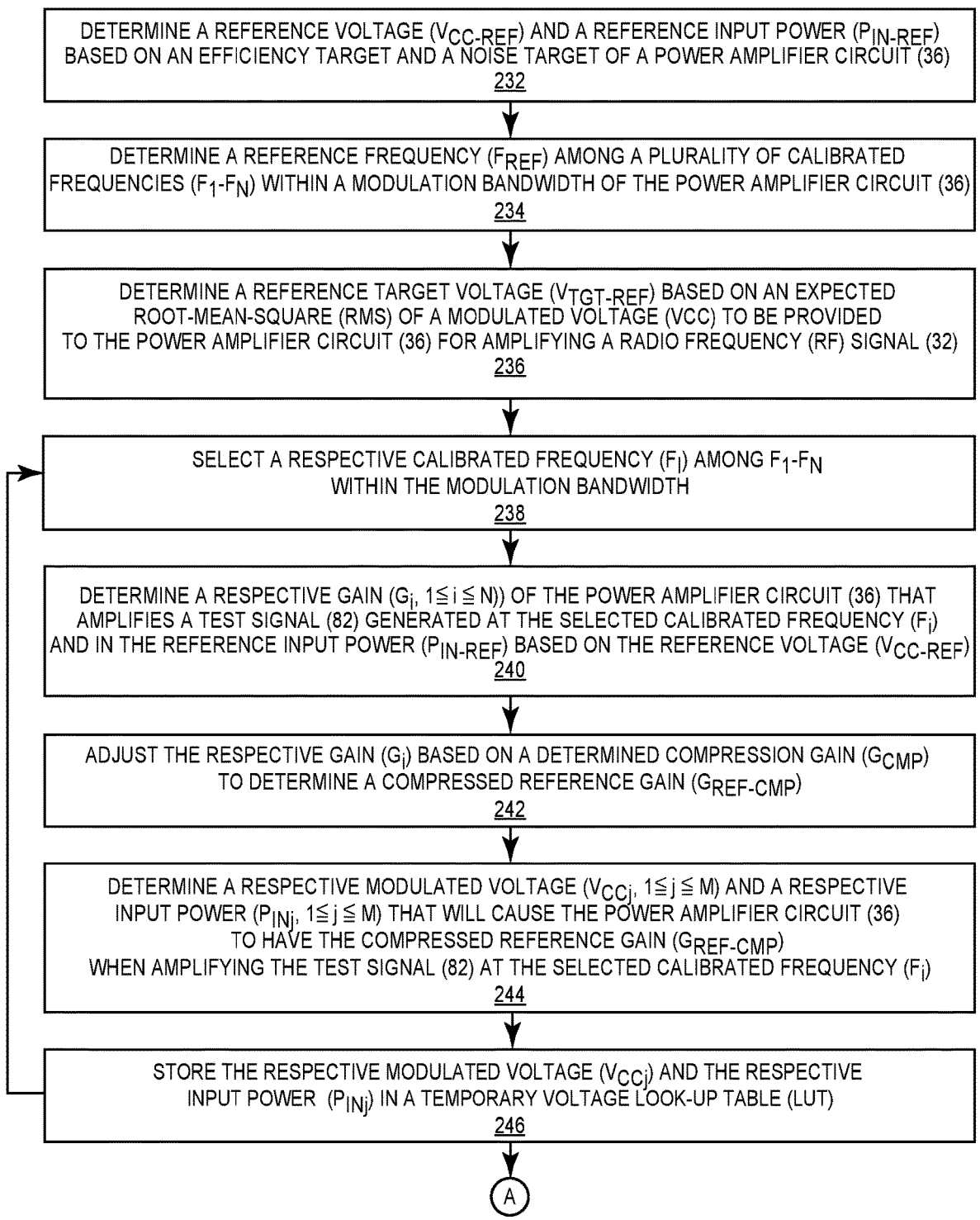
FIG. 9 is a flowchart of an exemplary process that can be employed by the transceiver circuit of FIG. 5 to determine a gain offset LUT according to an alternative embodiment of the present disclosure.
Figure 9:
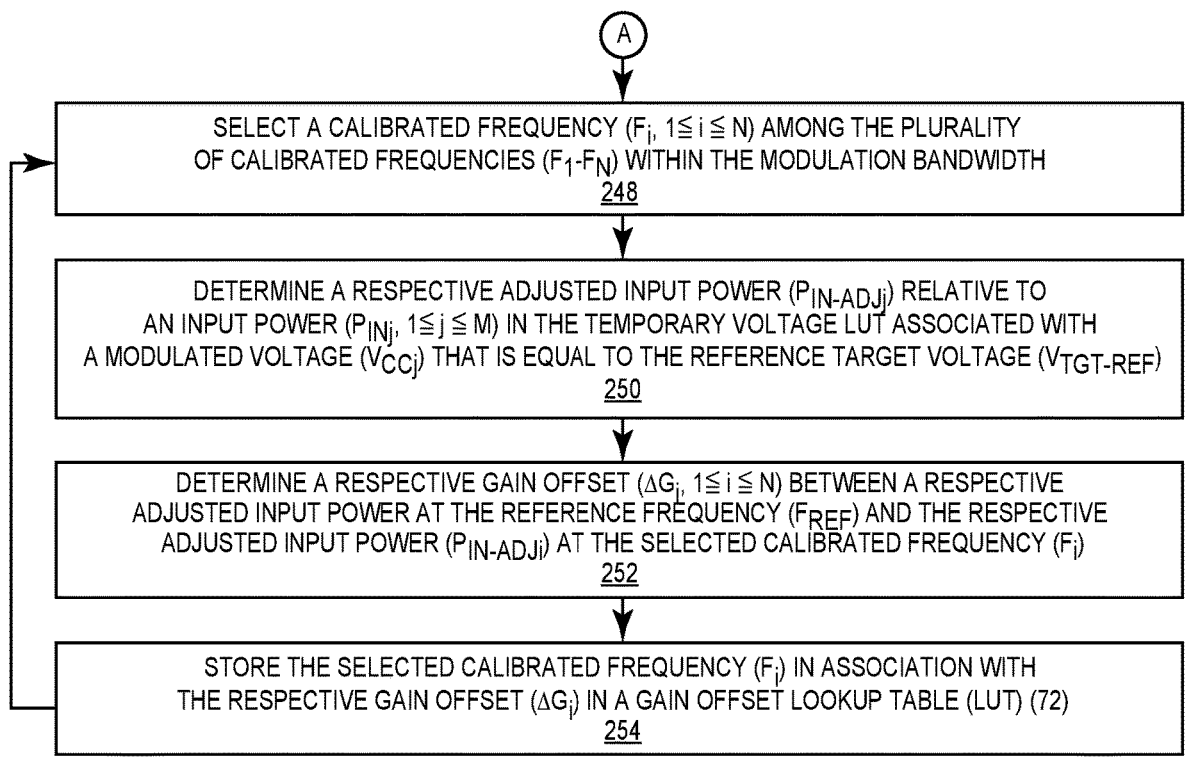

In an embodiment, the calibration circuit 80 may determine and store the gain offset LUT 72 (step 202) in the memory circuit 70 based on an alternative process. In this regard, FIG. 9 is a flowchart of an exemplary process 230 that can be employed by the calibration circuit 80 in the transceiver circuit 68 of FIG. 5 to determine the gain offset LUT 72 according to another embodiment of the present disclosure. Elements in FIG. 5 are referenced in conjunction with the discussion of FIG. 9 and will not be re-described herein.

Herein, the calibration circuit 80 is configured to determine a reference voltage $V_{CC\text{-}REF}$ and a reference input power $P_{IN\text{-}REF}$ based on an efficiency target and/or a noise target of the power amplifier circuit 36 (step 232). In other words, the reference voltage $V_{CC\text{-}REF}$ and the reference input power $P_{IN\text{-}REF}$ can be determined empirically to achieve a desired trade-off between the efficiency target and the noise target of the power amplifier circuit 36. Although the calibration circuit 80 is configured herein to determine a reference input power $P_{IN\text{-}REF}$, it should be appreciated that it is also possible to replace the reference input power $P_{IN\text{-}REF}$ with a corresponding reference output power.

The calibration circuit 80 then determines a reference frequency FREF among the calibrated frequencies $F_1$-$F_N$ within the modulation bandwidth of the power amplifier circuit 36 (step 234). In a non-limiting example, the reference frequency FREF can be the center frequency $F_C$ among the calibrated frequencies $F_1$-$F_N$.

Next, the calibration circuit 80 determines a reference target voltage ($V_{TGT\text{-}REF}$) based on an expected RMS of the modulated voltage $V_{CC}$ (e.g., 2.5 V) to be provided to the power amplifier circuit 36 for amplifying the RF signal 32 in the transmission circuit 30 of FIG. 3 (step 236).

Next, the calibration circuit 80 selects a calibrated frequency $F_i$ among the calibrated frequencies $F_1$-$F_N$ within the modulation bandwidth (step 238). The calibration circuit 80 determines a respective gain $G_i$ (1≤i≤N) of the power amplifier circuit 36 when the power amplifier circuit 36 amplifies the test signal 82 that is generated at the selected calibrated frequency $F_i$ and in the reference input power $P_{IN\text{-}REF}$ based on the reference voltage $V_{CC\text{-}REF}$ (step 240).

The calibration circuit 80 then adjusts the respective gain $G_i$ based on a determined compression gain $G_{CMP}$ to determine a compressed reference gain $G_{REF\text{-}CMP}$ (step 242). Notably, the calibration circuit 80 may determine compression gain $G_{CMP}$ empirically to achieve a desired linearity target of the power amplifier circuit 36.

The calibration circuit 80 then determines a respective modulated voltage $V_{CCj}$ (1≤j≤M) and a respective input power $P_{INj}$ (1≤j≤M) that will cause the power amplifier circuit 36 to have the compressed reference gain $G_{REF}$-CMP when amplifying the test signal 82 at the selected calibrated frequency $F_i$ (step 244). Herein, M may be identical to or different from N. Accordingly, the calibration circuit 80 can store the respective modulated voltage $V_{CCj}$ and the respective input power $P_{INj}$ in a temporary voltage LUT (not shown) in the memory circuit 70 (step 246). The calibration circuit 80 is configured to repeat steps 238-246 for each of the calibrated frequencies $F_1$-$F_N$.

With continuing reference to FIG. 9, the calibration circuit 80 selects a calibrated frequency $F_i$ (1≤i≤N) among the calibrated frequencies $F_1$-$F_N$ within the modulation bandwidth (step 248). The calibration circuit 80 then determines a respective adjusted input power $P_{IN\text{-}ADJi}$ (1≤i≤N) relative to an input power $P_{INj}$ (1≤j≤M) in the temporary voltage LUT associated with a modulated voltage $V_{CCj}$ (1≤j≤M) that is equal to the reference target voltage $V_{TGT\text{-}REF}$ (step 250).

Subsequently, the calibration circuit 80 determines a respective gain offset $\Delta G_i$ (1≤i≤N) between a respective adjusted input power at the reference frequency FREF and the respective adjusted input power $P_{IN}$-ADJi at the selected calibrated frequency $F_i$ (step 252). The calibration circuit 80 then stores the selected calibrated frequency $F_i$ in association with the respective gain offset $\Delta G_i$ in the gain offset LUT 72 (step 254). Notably, the calibration circuit 80 is configured to repeat steps 248-254 for each of the calibrated frequencies $F_1$-$F_N$.

Figure 10:
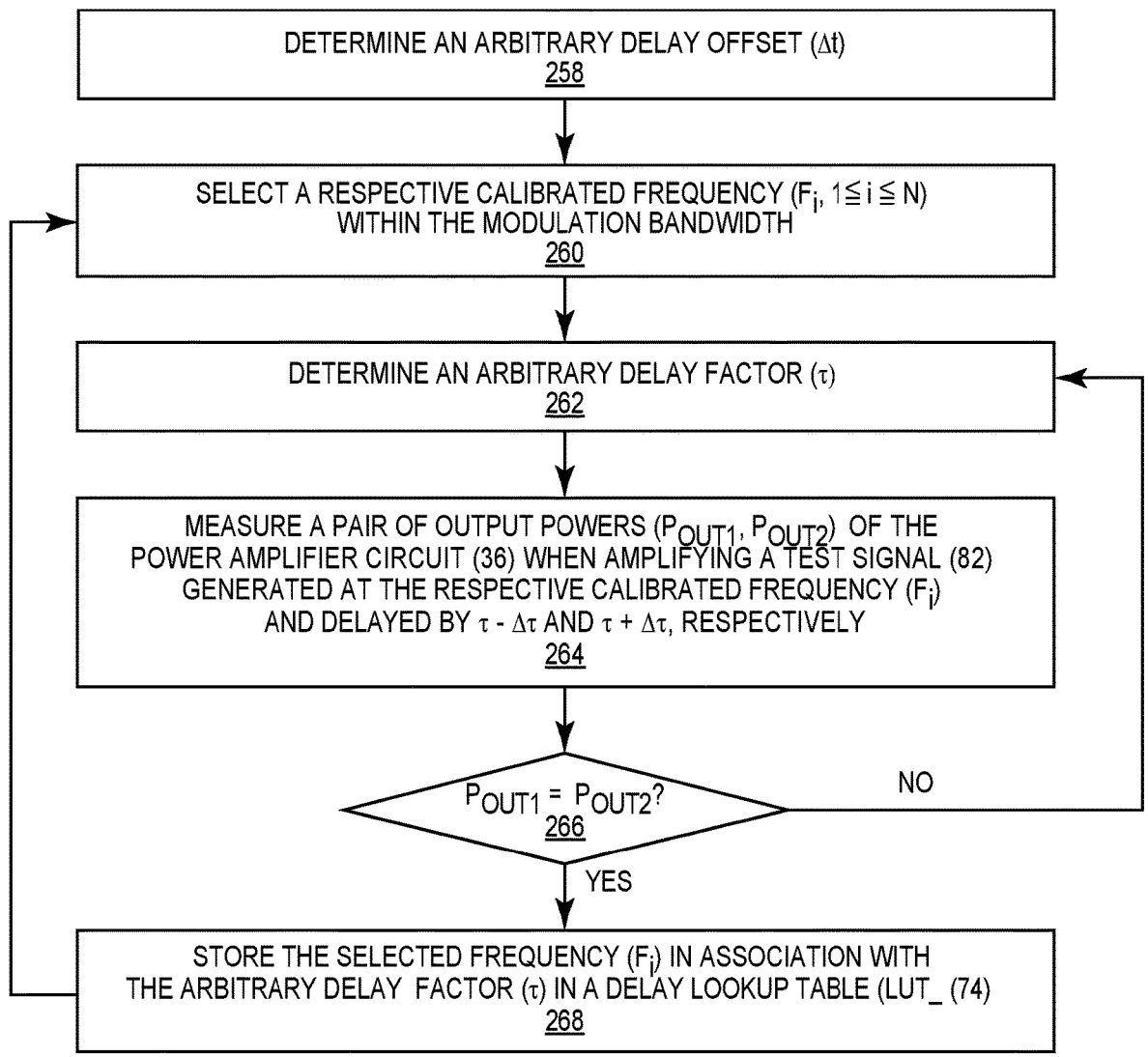
FIG. 10 is a flowchart of an exemplary process that can be employed by the transceiver circuit of FIG. 5 to determine a delay LUT as part of the calibration process of FIG. 6.

In an embodiment, the calibration circuit 80 may determine and store the delay LUT 74 (step 204) in the memory circuit 70 based on a process. In this regard, FIG. 10 is a flowchart of an exemplary process 256 that can be employed by the transceiver circuit 68 of FIG. 5 to determine the delay LUT 74 as part of the calibration process 200 of FIG. 6. Elements in FIG. 5 are referenced in conjunction with the discussion of FIG. 10 and will not be re-described herein.

Herein, the calibration circuit 80 first determines an arbitrary delay offset $\Delta t$ (step 258). Next, the calibration circuit 80 selects a calibrated frequency $F_i$ ($1 \leq i \leq N$) among the calibrated frequencies $F_1$-$F_N$ within the modulation bandwidth (step 260). The calibration circuit 80 then determines an arbitrary delay factor $\tau$ (step 264). The calibration circuit 80 then measures a pair of output powers $P_{OUT1}$, $P_{OUT2}$ of the power amplifier circuit 36 when the power amplifier circuit 36 amplifies the test signal 82 that is generated at the selected calibrated frequency $F_i$ and delayed by $\tau \pm \Delta t$, respectively (step 264).

The calibration circuit 80 checks whether the pair of output powers $P_{OUT1}$ and $P_{OUT2}$ are equal (step 266). In an embodiment, the calibration circuit 80 may treat the pair of output powers $P_{OUT1}$ and $P_{OUT2}$ as being equal if a difference between the pair of output powers $P_{OUT1}$ and $P_{OUT2}$ is smaller than a predefined threshold.

If the pair of output powers $P_{OUT1}$ and $P_{OUT2}$ are equal, the calibration circuit 80 stores the selected calibrated frequency $F_i$ in association with arbitrary delay factor $\tau$ in the delay LUT 74 (step 268). Otherwise, the calibration circuit 80 will return to step 262 and determine a new arbitrary delay factor $\tau$. The calibration circuit 80 may adjust (e.g., increase) the predefined threshold in case the pair of output powers $P_{OUT1}$ and $P_{OUT2}$ remain unequal after several iterations. Notably, the calibration circuit 80 is configured to repeat steps 260-268 for each of the calibrated frequencies $F_1$-$F_N$.

Those skilled in the art will recognize improvements and modifications to the preferred embodiments of the present disclosure. All such improvements and modifications are considered within the scope of the concepts disclosed herein and the claims that follow.

What is claimed is:

1. A transceiver circuit comprising:
   a memory circuit; and
   a calibration circuit coupled to a power amplifier circuit and configured to:
      determine and store a plurality of gain offset entries in a gain offset lookup table (LUT) in the memory circuit to correlate a plurality of calibrated frequencies comprising a center frequency and multiple non-center frequencies within a modulation bandwidth of the power amplifier circuit with a plurality of gain offsets, respectively, wherein each of the plurality of gain offsets is determined relative to a reference frequency within the modulation bandwidth; and
      determine and store a plurality of delay offset entries in a delay offset LUT in the memory circuit to correlate the plurality of calibrated frequencies with a plurality of delay factors, respectively.

2. The transceiver circuit of claim 1, wherein the reference frequency corresponds to the center frequency of the modulation bandwidth.

3. The transceiver circuit of claim 1, wherein the calibration circuit is further configured to:
   determine a minimum reference voltage and a minimum reference input power;
   determine a reference frequency among the plurality of calibrated frequencies within the modulation bandwidth;
   determine a reference target voltage based on an expected root-mean-square (RMS) of a modulated voltage to be provided to the power amplifier circuit for amplifying a radio frequency (RF) signal; and
   for each of the plurality of calibrated frequencies:
      determine a respective gain of the power amplifier circuit that amplifies a test signal generated at the calibrated frequency and in the determined minimum reference input power based on the determined minimum reference voltage;
      determine a respective modulated voltage and a respective input power that cause the power amplifier circuit to have the respective gain when amplifying the test signal at the calibrated frequency; and
      store the respective modulated voltage in association with the respective input power in a temporary voltage LUT.

4. The transceiver circuit of claim 3, wherein the calibration circuit is further configured to determine the minimum reference voltage and the minimum reference input power based on a trade-off between one or more of:
   an efficiency target of the power amplifier circuit;
   a noise target of the power amplifier circuit; and
   a linearity target of the power amplifier circuit.

5. The transceiver circuit of claim 3, wherein, for each of the plurality of calibrated frequencies, the calibration circuit is further configured to:
   determine a respective adjusted input power relative to an input power in the temporary voltage LUT associated with a modulated voltage that is equal to the reference target voltage;
   determine a respective one of the plurality of gain offsets between a respective adjusted input power at the reference frequency and the respective adjusted input power at the calibrated frequency; and
   store the respective calibrated frequency in association with the respective one of the plurality of gain offsets in the gain offset LUT.

6. The transceiver circuit of claim 1, wherein the calibration circuit is further configured to:
   determine a reference voltage and a reference input power;
   determine a reference frequency among the plurality of calibrated frequencies within the modulation bandwidth;
   determine a reference target voltage based on an expected root-mean-square (RMS) of a modulated voltage to be provided to the power amplifier circuit for amplifying a radio frequency (RF) signal; and
   for each of the plurality of calibrated frequencies:
      determine a respective gain of the power amplifier circuit that amplifies a test signal generated at the calibrated frequency and in the determined reference input power based on the determined reference voltage;
      adjust the respective gain based on a determined compression gain to determine a compressed gain;
      determine a respective modulated voltage and a respective input power that will cause the power amplifier circuit to have the compressed gain when amplifying the test signal at the calibrated frequency; and
      store the respective modulated voltage and the respective input power in a temporary voltage LUT.

7. The transceiver circuit of claim 6, wherein the calibration circuit is further configured to determine the reference voltage and the reference input power based on a trade-off between one or more of:

an efficiency target of the power amplifier circuit; and
a noise target of the power amplifier circuit.

8. The transceiver circuit of claim 6, wherein, for each of the plurality of calibrated frequencies, the calibration circuit is further configured to:
determine a respective adjusted input power relative to an input power in the temporary voltage LUT associated with a modulated voltage that is equal to the reference target voltage;
determine a respective one of the plurality of gain offsets between a respective input power at the reference frequency and the respective input power at the calibrated frequency; and
store the calibrated frequency in association with the respective one of the plurality of gain offsets in the gain offset LUT.

9. The transceiver circuit of claim 1, wherein, for each of the plurality of calibrated frequencies, the calibration circuit is further configured to:
determine an arbitrary delay factor;
measure a pair of output powers of the power amplifier circuit when amplifying a test signal generated at the respective calibrated frequency and delay by the arbitrary delay factor minus an arbitrary delay offset and the arbitrary delay factor plus the arbitrary delay offset; and
store the respective calibrated frequency in association with the arbitrary delay factor in the delay LUT in response to the pair of output powers being equal.

10. The transceiver circuit of claim 9, wherein the calibration circuit is further configured to:
determine a new arbitrary delay factor in response to the pair of output powers being unequal;
measure a new pair of output powers of the power amplifier circuit when amplifying the test signal generated at the respective calibrated frequency and delay by the new arbitrary delay factor minus the arbitrary delay offset and the new arbitrary delay factor plus the arbitrary delay offset; and
store the respective calibrated frequency in association with the new arbitrary delay factor in the delay LUT in response to the pair of output powers being equal.

11. A method for calibrating an equalization filter in a transceiver circuit comprising:
determining and storing a plurality of gain offset entries in a gain offset lookup table (LUT) to correlate a plurality of calibrated frequencies comprising a center frequency and multiple non-center frequencies within a modulation bandwidth with a plurality of gain offsets, respectively, wherein each of the plurality of gain offsets is determined relative to a reference frequency within the modulation bandwidth; and
determining and storing a plurality of delay offset entries in a delay offset LUT to correlate the plurality of calibrated frequencies with a plurality of delay factors, respectively.

12. The method of claim 11, further comprising selecting the center frequency of the modulation bandwidth as the reference frequency.

13. The method of claim 11, further comprising:
determining a minimum reference voltage and a minimum reference input power;
determining a reference frequency among the plurality of calibrated frequencies within the modulation bandwidth;
determining a reference target voltage based on an expected root-mean-square (RMS) of a modulated voltage to be provided to a power amplifier circuit for amplifying a radio frequency (RF) signal; and
for each of the plurality of calibrated frequencies:
determining a respective gain of the power amplifier circuit that amplifies a test signal generated at the calibrated frequency and in the determined minimum reference input power based on the determined minimum reference voltage;
determining a respective modulated voltage and a respective input power that cause the power amplifier circuit to have the respective gain when amplifying the test signal at the calibrated frequency; and
storing the respective modulated voltage in association with the respective input power in a temporary voltage LUT.

14. The method of claim 13, further comprising, for each of the plurality of calibrated frequencies:
determining a respective adjusted input power relative to an input power in the temporary voltage LUT associated with a modulated voltage that is equal to the target voltage;
determining a respective one of the plurality of gain offsets between a respective adjusted input power at the reference frequency and the respective adjusted input power at the calibrated frequency; and
storing the respective calibrated frequency in association with the respective one of the plurality of gain offsets in the gain offset LUT.

15. The method of claim 11, further comprising:
determining a reference voltage and a reference input power;
determining a reference frequency among the plurality of calibrated frequencies within the modulation bandwidth;
determining a reference target voltage based on an expected root-mean-square (RMS) of a modulated voltage to be provided to a power amplifier circuit for amplifying a radio frequency (RF) signal; and
for each of the plurality of calibrated frequencies:
determining a respective gain of the power amplifier circuit that amplifies a test signal generated at the calibrated frequency and in the determined reference input power based on the determined reference voltage;
adjusting the respective gain based on a determined compression gain to determine a compressed reference gain; and
determining a respective modulated voltage and a respective input power that will cause the power amplifier circuit to have the compressed reference gain when amplifying the test signal at the calibrated frequency; and
store the respective modulated voltage and the respective input power in a temporary voltage LUT.

16. The method of claim 15, further comprising, for each of the plurality of calibrated frequencies:
determining a respective adjusted input power relative to an input power in the temporary voltage LUT associated with a modulated voltage that is equal to the target voltage;
determining a respective one of the plurality of gain offsets between a respective input power at the reference frequency and the respective input power at the calibrated frequency; and
storing the respective calibrated frequency in association with the respective one of the plurality of gain offsets in the gain offset LUT.

17. The method of claim 11, further comprising, for each of the plurality of calibrated frequencies:
  determining an arbitrary delay factor;
  measuring a pair of output powers of a power amplifier circuit when amplifying a test signal generated at the respective calibrated frequency and delay by the arbitrary delay factor minus an arbitrary delay offset and the arbitrary delay factor plus the arbitrary delay offset; and
  storing the respective calibrated frequency in association with the arbitrary delay factor in the delay LUT in response to the pair of output powers being equal.

18. The method of claim 17, further comprising:
  determining a new arbitrary delay factor in response to the pair of output powers being unequal;
  measuring a new pair of output powers of the power amplifier circuit when amplifying the test signal generated at the respective calibrated frequency and delay by the new arbitrary delay factor minus the arbitrary delay offset and the new arbitrary delay factor plus the arbitrary delay offset; and
  storing the respective calibrated frequency in association with the new arbitrary delay factor in the delay LUT in response to the pair of output powers being equal.

* * * * *